United States Patent [19]
Sakai

[11] Patent Number: 5,696,397
[45] Date of Patent: Dec. 9, 1997

[54] INPUT PROTECTION CIRCUIT AND METHOD OF FABRICATING SEMICONDUCTOR INTEGRATED CIRCUIT

[75] Inventor: Isami Sakai, Tokyo, Japan

[73] Assignee: NEC Corporation, Tokyo, Japan

[21] Appl. No.: 638,766

[22] Filed: Apr. 29, 1996

[30] Foreign Application Priority Data

Apr. 28, 1995 [JP] Japan ................................ 7-106391

[51] Int. Cl.$^6$ .................................................. H01L 23/62
[52] U.S. Cl. .......................... 257/355; 257/356; 257/357; 257/360; 257/361; 361/91
[58] Field of Search ..................... 257/355, 356, 257/357, 360, 361, 173, 174; 361/91

[56] References Cited

U.S. PATENT DOCUMENTS

| | | | |
|---|---|---|---|
| 4,609,931 | 9/1986 | Koike | 357/23.13 |
| 4,949,212 | 8/1990 | Lenz et al. | 361/56 |
| 5,272,586 | 12/1993 | Yen | 361/111 |
| 5,532,178 | 7/1996 | Liaw et al. | 437/57 |

FOREIGN PATENT DOCUMENTS 563540   3/1993   Japan .

*Primary Examiner*—Sara W. Crane
*Assistant Examiner*—Andrew W. Seacord, II

[57] ABSTRACT

The present invention provides an input protection circuit including a first MOS FET including a source electrically connected to an input terminal and a drain and a gate both electrically connected to a grounding line, a second MOS FET including a source electrically connected to the input terminal and a drain and a gate, and a third MOS FET including a source electrically connected to a power line and a drain and a gate to both of which are electrically connected a drain and a gate of the second MOS FET. The input protection circuit shares a parasitic p-MOS transistor with an internal circuit, and hence it is no longer necessary to form a parasitic MOS transistor to be used only for an input protection circuit. Thus, the input protection circuit decreases the number of photomask using steps by one relative to a conventional protection circuit. In addition, the sharing a parasitic MOS transistor with an internal circuit makes it possible to prevent a current from running from an input terminal to a power line, even if a voltage higher than a source voltage is input to the input terminal. Thus, it is possible to enhance resistance to electrostatic breakdown, and fabricate an integrated circuit having high reliability with lower cost.

10 Claims, 11 Drawing Sheets

FIG. I
PRIOR ART
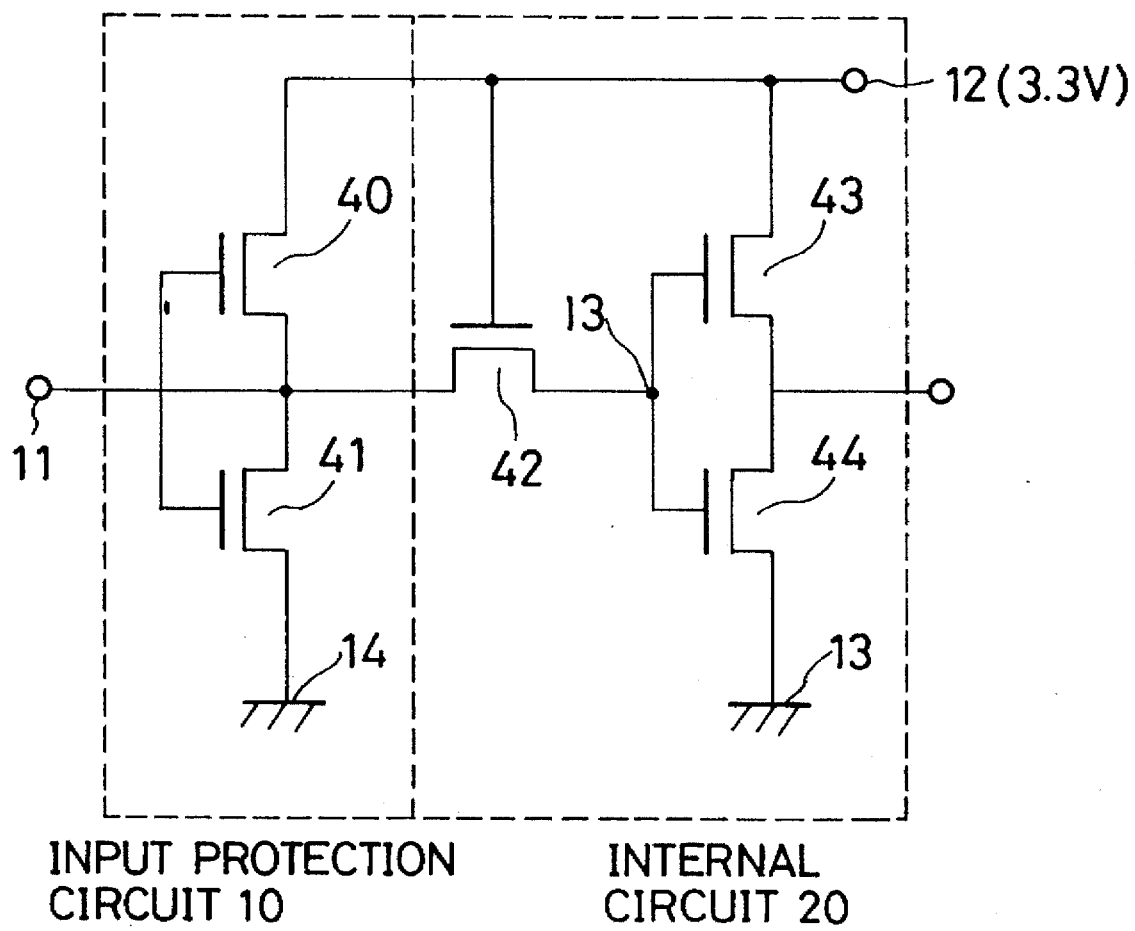
INPUT PROTECTION CIRCUIT 10
INTERNAL CIRCUIT 20

INPUT PROTECTION
CIRCUIT 25

INTERNAL
CIRCUIT 30

5,696,397

1

INPUT PROTECTION CIRCUIT AND METHOD OF FABRICATING SEMICONDUCTOR INTEGRATED CIRCUIT

BACKGROUND OF THE INVENTION

1. Field of the Invention

The invention relates to a semiconductor integrated circuit, and more particularly to an input protections circuit to be contained in a semiconductor integrated circuit.

2. Description of the Prior Art

With a size of an integrated circuit being remarkably decreased down, a source voltage is also reduced. Namely, a source voltage is now shifting from 5 V to 3.3 V. However, all of source voltages are not always shifted to 3.3 V, and hence a circuit board often includes both an integrated circuit which operates at 5 V and an integrated circuit which operates at 3.3 V. Accordingly, an integrated circuit which operates at 3.3 V sometimes has to receive input signals of 5 V. In addition, it is necessary for an input protection circuit included in such a circuit board for protecting integrated circuits to have sufficient resistance to electrostatic breakdown for protecting an internal circuit even when an excess voltage is applied thereto.

For instance, Japanese Unexamined Patent Public Disclosure No. 5-63540 has suggested an input protection circuit for preventing a MOS transistor form being destroyed when a voltage higher than a source voltage is applied to an input terminal. Specifically, the circuit includes: a p-channel MOS transistor having a gate electrode electrically connected to an input terminal, a source electrode electrically connected to a higher voltage source terminal, and a drain electrode electrically connected to an output terminal; a first n-channel MOS transistor having a source electrode electrically connected to a lower voltage source terminal, and a drain electrode electrically connected to the output terminal; and a second n-channel MOS transistor having a gate electrode electrically connected to the higher voltage source terminal, a source electrode electrically connected to the input terminal, and a drain electrode electrically connected to the gate electrode of the first n-channel MOS transistor.

Another example of an input protection circuit will be explained hereinbelow with reference to FIG. 1 A circuit illustrated in FIG. 1 comprises an input protection circuit 10 and an internal circuit 20 to be protected by the input protection circuit 10. The input protection circuit 10 includes parasitic n-MOS transistors 40 and 41 in an initial stage, whereas the internal circuit 20 includes n-MOS transistors 42, 44 and a p-MOS transistor 43. As illustrated in FIG. 1, the n-MOS transistor 40 having a threshold voltage of about 6 V and a field oxide as a gate oxide is disposed between an input terminal 11 and a power line 12, whereas the n-MOS transistor 41 is disposed between the input terminal 11 and a grounding line 14. The threshold voltage of the parasitic n-MOS transistors 40 and 41 is lower than a threshold voltage of a parasitic n-MOS transistor used for device isolation in the internal circuit 20.

The input terminal 11 is electrically connected to gate electrodes of both the n-MOS transistor 44 and the p-MOS transistor 43 through a pass gate of the n-MOS transistor 42 having a threshold voltage of 0 V. To the power line 12 is applied a voltage of 3.3 V.

In the input protection circuit 10 illustrated in FIG. 1, even if a voltage of 5 V is applied to the input terminal 11, merely 3.3 V is applied to a gate electrode of the n-MOS transistor 42 having a threshold voltage of 0 V. Hence, a drain terminal

2

13 of the n-MOS transistor 42 has 3.3 V applied thereto, and thereby, to gate electrodes of the p-MOS transistor 43 and n-MOS transistor 44 is applied 3.3 V equal to a source voltage.

If a voltage of thousands of volts is instantaneously applied to the input terminal 11, for instance, if an operator contacts the input terminal 11 and hence electric charges contained in the operator run into the input terminal 11, the electric charges flow into the power line 12 or the grounding line 14 via the parasitic n-MOS transistor 41. Hence, an excessive voltage is not applied to the drain electrode of the n-MOS transistor 42 and the gate electrodes of the p-MOS transistor 43 and the n-MOS transistor 44, resulting in that the input protection circuit 10 and the internal circuit 20 are protected.

The reason of the above mentioned phenomenon is as follows. The parasitic n-MOS transistors 40 and 41 both of which act as an input protection element have a threshold voltage of about 6 V which is lower than a breakdown voltage of a source-drain junction of a MOS transistor. Thus, even if a high voltage is applied to the input terminal 11, electric charges flow uniformly through the parasitic n-MOS transistors 40 and 41, which prevents the circuit from being locally heated to thereby prevent the source-drain junction from being destroyed.

If the parasitic n-MOS transistors 40 and 41 have a higher threshold voltage than a breakdown voltage of a source-drain junction, the electric charges would concentrate to a region having a lower junction breakdown voltage, namely, a source-drain junction, thereby the circuit is locally heated with the result of destruction of the source-drain junction.

Hereinbelow, with reference to FIGS. 2A to 2H, will be explained a method of fabricating a semiconductor integrated circuit including therein the input protection circuit illustrated in FIG. 1.

First, as illustrated in FIG. 2A, on a p-type silicon substrate 301 are formed a pad oxide film 302 and a nitride film 303. Then, the nitride film 303 is etched by using photoresist 304 patterned in an active region as a mask.

Then, as illustrated in FIG. 2B, subsequently to removal of the photoresist 304, the p-type silicon substrate 301 is selectively oxidized by using the nitride film 303 as a mask to thereby form field oxides 306 for device isolation. After the pad oxide film 302 has been removed, an oxide film 307 is made grown by a thickness of 20 nm. Then, a region other than a region in which a p-MOS transistor is to be formed is covered with photoresist 308. Phosphorus (P) is ion-implanted to the p-type silicon substrate 301 at 1 MeV at a dose of about $3 \times 10^{13}$ cm$^{-2}$ to thereby form an n-well 309. Subsequently, phosphorus (P) is ion-implanted to the n-well 309 at 400 KeV at a dose of about $1 \times 10^{13}$ cm$^{-2}$ to thereby form an n$^+$ channel stopper 310. The formation of the n$^+$ channel stopper 310 causes a parasitic p-MOS transistor having the field oxides 306 as a gate oxide film to have a threshold voltage of about −12 V, which would suppress current leakage between p-MOS transistors. Then, though not illustrated, ion-implanting of boron (B) is carried out to cause the p-MOS transistor to have a threshold voltage of −0.6 V.

After removal of the photoresist 308, as illustrated in FIG. 2C, a region other than a region in which an n-MOS transistor having a threshold voltage of 0.6 V is to be formed is covered with photoresist 311. Boron (B) is ion-implanted to the p-type silicon substrate 301 through a non-masked surface thereof at 500 KeV at a dose of about $3 \times 10^{13}$ cm$^{-2}$ to thereby form a p-well 312. Subsequently, boron (B) is ion-implanted to the p-well 312 at 200 KeV at a dose of about $1\times10^{13}$ cm$^{-2}$ to thereby form a p$^+$ channel stopper 313. The formation of the p$^+$ channel stopper 313 causes a parasitic n-MOS transistor having the field oxides 306 as a gate oxide film to have a threshold voltage of about 12 V, which would suppress current leakage between n-MOS transistors. Then, though not illustrated, ion-implanting of boron (B) is carried out to cause the n-MOS transistor 44 to have a threshold voltage of 0.6 V.

After removal of the photoresist 311, as illustrated in FIG. 2D, a region other than a region in which an n-MOS transistor having a threshold voltage of 0 V is to be formed is covered with photoresist 501. Boron (B) is ion-implanted to the p-type silicon substrate 301 through a non-masked surface thereof at 200 KeV at a dose of about $5\times10^{12}$ cm$^{-2}$ to thereby form a p$^+$ channel stopper 502. The formation of the p$^+$ channel stopper 502 causes a parasitic n-MOS transistor having the field oxides 306 as a gate oxide film to have a threshold voltage of about 6 V. At this stage, the region in which the n-MOS transistor is to be formed has a surface having impurity concentration of about $1\times10^{15}$ cm$^{-3}$ equal to the impurity concentration of the p-type silicon substrate 301, and hence the n-MOS transistor would come to have a threshold voltage of about 0 V.

Then, as illustrated in FIG. 2E, after the photoresist 501 and the oxide film 307 have been removed, a gate oxide film 314 is made grown by a thickness of 10 nm. Three gate electrodes 315 are formed of polysilicon on the gate oxide film 314.

Then, as illustrated in FIG. 2F, a region other than a region in which a p-MOS transistor is to be formed is covered with photoresist 316. Ion-implanting of BF$_2$ is carried out to the p-type silicon substrate 301 through a non-masked surface thereof at 70 KeV at a dose of about $3\times10^{15}$ cm$^{-2}$ to thereby form a p$^+$ diffusion layer 317. Thus, there are formed a p-MOS transistor 318 having a threshold voltage of −0.6 V and a parasitic p-MOS transistor 319 having the field oxides 306 as a gate oxide and also having a threshold voltage of −12 V.

Then, as illustrated in FIG. 2G, after the photoresist 316 has been removed, a region in which the p-MOS transistor is to be formed is covered with photoresist 320. Subsequently, ion-implanting of arsenic (As) is carried out at 70 KeV at a dose of about $3\times10^{15}$ cm$^{-2}$ to thereby form an n$^+$ diffusion layer 321. Thus, there are formed an n-MOS transistor 322 having a threshold voltage of −0.6 V, which corresponds to the transistor 44 illustrated in FIG. 1, a parasitic n-MOS transistor 323 having the field oxides 306 as a gate oxide and also having a threshold voltage of 12 V, an n-MOS transistor 324 having a threshold voltage of 0 V, which corresponds to the transistor 42 illustrated in FIG. 1, and a parasitic n-MOS transistor 325 having the field oxides 306 as a gate oxide and also having a threshold voltage of 6 V, which corresponds to the transistors 40 and 41 illustrated in FIG. 1.

Then, as illustrated in FIG. 2H, an interlayer insulating film 326 is deposited over a resultant. There are formed contact holes through the interlayer insulating film 326, and then aluminum electrodes 327 and the aluminum gate electrodes 328 are formed. Thus, the semiconductor integrated circuit is completed.

The conventional input protection circuit as mentioned above needs the parasitic n-MOS transistor 325 having a lower threshold voltage than the parasitic n-MOS transistor 323 to be used for device isolation in the internal circuit 20. Thus, it was necessary to additionally carry out a photomask step, namely, the step of forming the photoresist 501 (see FIG. 2D). Since a photomask step requires an expensive exposure apparatus called a stepper (step and repeat photo-lithographic system with demagnification) to be carried out, an additional photomask step causes the fabrication cost to raise.

SUMMARY OF THE INVENTION

It is an object of the present invention to provide an input protection circuit having high resistance to electrostatic breakdown without an additional photoresist using step, and also to provide a method of fabricating a semiconductor integrated circuit including an input protection circuit.

The present invention provides an input protection circuit including (a) a first MOS FET having a source electrically connected to an input terminal, and a drain and a gate both electrically connected to a grounding line, (b) a second MOS FET having a source electrically connected to the input terminal, and a drain and a gate, and (c) a third MOS FET having a source electrically connected to a power line, and a drain and a gate to both of which are electrically connected a drain and a gate of the second MOS FET.

It is preferable that the first and second MOS FETs are p-channel parasitic MOS FETs having a low threshold value, and that the third MOS FET is an n-channel parasitic MOS FET having a high threshold value.

The first MOS FET preferably has a field oxide film as a gate oxide film, and has the same threshold voltage as that of device isolation regions. Similarly, the second MOS FET preferably has a field oxide film as a gate oxide film, and has the same threshold voltage as that of device isolation regions. The third MOS FET preferably has a field oxide film as a gate oxide film, and has the same threshold voltage as that of device isolation regions.

The present invention further provides a semiconductor integrated circuit including an internal circuit and an input protection circuit through which inputs are transmitted to the internal circuit and which protects the internal circuit, the internal circuits having therein a plurality of parasitic MOS transistors which are shared with the input protection circuit.

In a preferred embodiment, the parasitic MOS transistors are transistors used for device isolation in the internal circuit.

The present invention still further provides a method of fabricating a semiconductor integrated circuit, including the steps of (a) forming a nitride film selectively on active regions of a semiconductor substrate, (b) implanting first impurities at a relatively small dose into regions other than regions on which the nitride film is formed, (c) forming field oxides by thermal oxidation selectively on inert regions of the semiconductor substrate by using the nitride film as a mask, (d) carrying out first ion-implanting of second impurities to interfaces between the field oxides and the semiconductor substrate selectively in a region in which a first MOS FET is to be fabricated, and (e) carrying out second ion-implanting of third impurities to interfaces between the field oxides and the semiconductor substrate selectively in a region in which a third MOS FET is to be fabricated and which is a region other than regions in which the first MOS FET and a second MOS FET are to be fabricated.

It is preferable that the semiconductor substrate is a p-type silicon substrate, and that the first and third impurities are p-type ones and the second impurities are n-type ones. It is also preferable that the first MOS FET is a p-channel one, and that the second MOS FET is an n-channel one and the third MOS FET is an n-channel one having a relatively low threshold voltage.

In the input protection circuit made in accordance with the present invention, there are disposed at initial stage of the input protection circuit a complementary circuit comprising the parasitic p-MOS transistor and the parasitic n-MOS transistor between the input terminal and the power line, and the p-MOS transistor between the input terminal and the grounding line. The n-well is electrically connected to the input terminal. These parasitic p- and n-MOS transistors are shared with the internal circuit for device isolation.

Thus, since the input protection circuit has the parasitic p-MOS transistor which is common to a transistor to be formed in the internal circuit, it is no longer necessary to form a specific parasitic MOS transistor to be used only for input protection. Accordingly, the present invention makes it possible to decrease the number of photomask steps by one relative to a conventional input protection circuit, resulting in lower fabrication cost.

In addition, since the input protection circuit shares the parasitic MOS transistors with the internal circuit, it is possible to prevent a current from running to the power line through the input terminal, even if a voltage higher than a source voltage is applied to the input terminal. Furthermore, an electric field can be relaxed by the resistance of the $p^+$ diffusion layer and the n-well both constituting the parasitic p-MOS transistor. As a result, it is possible to enhance resistance to electrostatic breakdown, and to provide an integrated circuit having higher reliability at lower cost.

In accordance with the method of fabricating a semiconductor integrated circuit, a parasitic n-MOS transistor having a low threshold voltage is to be formed by carrying out ion-implanting of boron. Thus, the method makes it possible to decrease the number of photomask steps by one relative to a conventional method, even if a conventional input protection circuit is to be used, resulting in decreasing fabrication cost.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1 is a circuit diagram of a conventional input protection circuit;

DESCRIPTION OF THE PREFERRED EMBODIMENTS

Preferred embodiments in accordance with the present invention will be explained hereinbelow with reference to drawings.

Hereinbelow, with reference to FIGS. 3 and 4, will be explained an input protection circuit to be fabricated in accordance with the embodiment of the present invention. A circuit illustrated in FIG. 3 comprises an input protection circuit 25 and an internal circuit 30 to be protected by the input protection circuit 25. The input protection circuit 25 includes parasitic p-MOS FETs 3 and 2, and a parasitic n-MOS FET 1 in an initial stage, whereas the internal circuit 30 includes n-MOS FETs 4, 6 and a p-MOS FET 5. The parasitic p-MOS FET 3 having a threshold voltage of about −12 V equal to that of device isolation regions and also having a field oxide as a gate oxide is disposed between an input terminal 11 and a grounding line 14, whereas the parasitic p-MOS FET 2 having a threshold voltage of about −12 V equal to that of device isolation regions and also having a field oxide as a gate oxide and the parasitic n-MOS FET 1 having a threshold voltage of about 12 V equal to that of device isolation regions and also having a field oxide as a gate oxide are disposed between the input terminal 11 and a power line 12.

The parasitic p-MOS FET 3 has a source and an n-well both electrically connected to the input terminal 11, and a gate and a drain both electrically connected to the grounding line 14. The parasitic p-MOS FET 2 has a source and an n-well both electrically connected to the input terminal 11, and a gate and a drain both electrically connected to a terminal 16. The parasitic n-MOS FET 1 has a gate and a drain both electrically connected to the terminal 16, a source electrically connected to a power line 12, and a p-well electrically connected to the grounding line 14. The input terminal 11 is electrically connected to gate electrodes of the n-MOS FET 6 and the p-MOS FET 5 through a pass gate of the n-MOS FET 4 having a threshold voltage of 0 V. To the power line 12 is applied a voltage of 3.3 V.

Figure 2A:
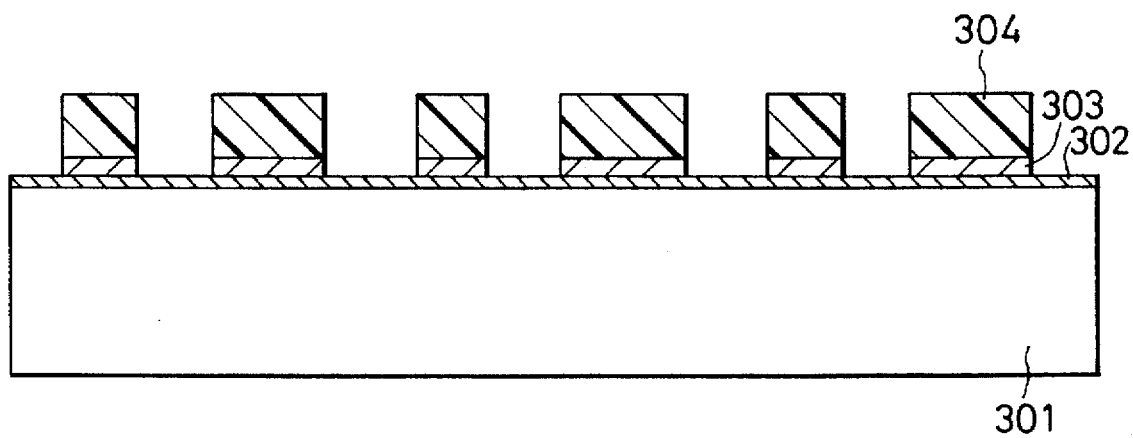
FIGS. 2A to 2H are cross-sectional views of a conventional input protection circuit, showing respective step of fabricating the conventional input protection circuit.
Figure 2B:
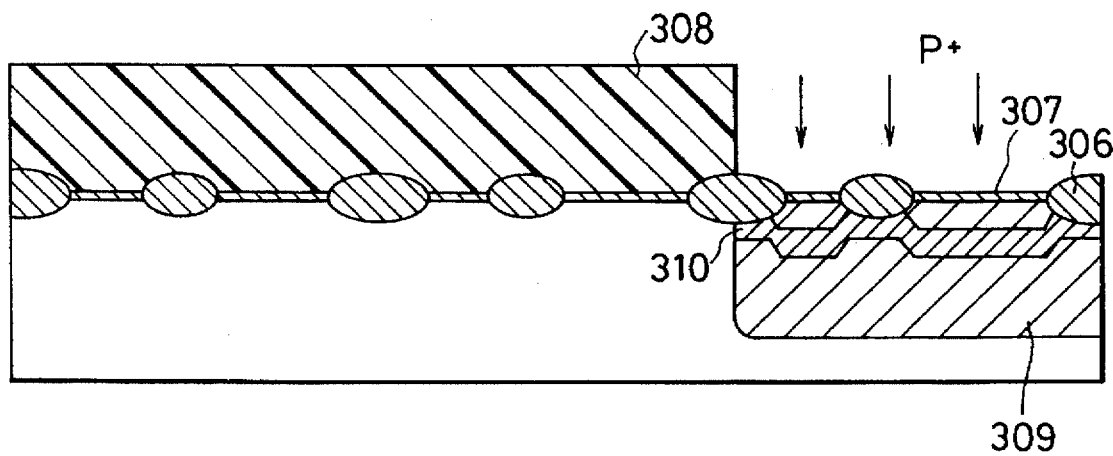
Figure 2C:
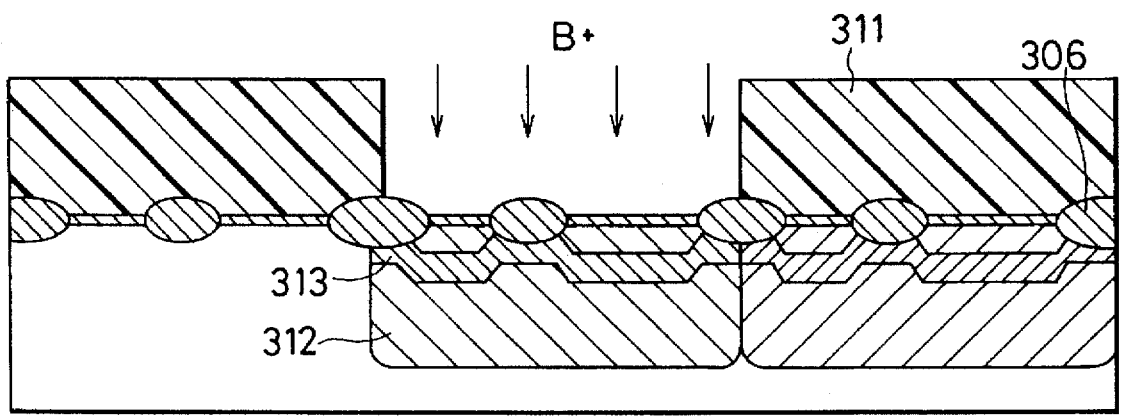
Figure 2D:
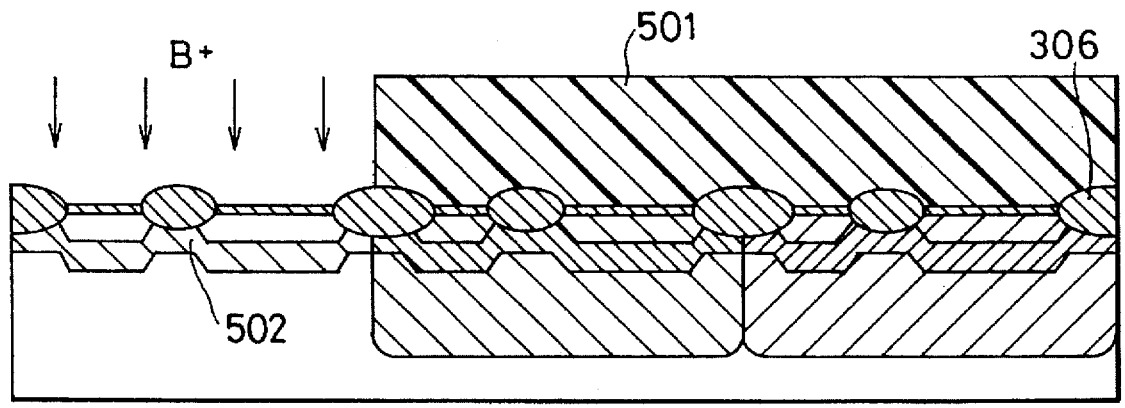
Figure 2E:
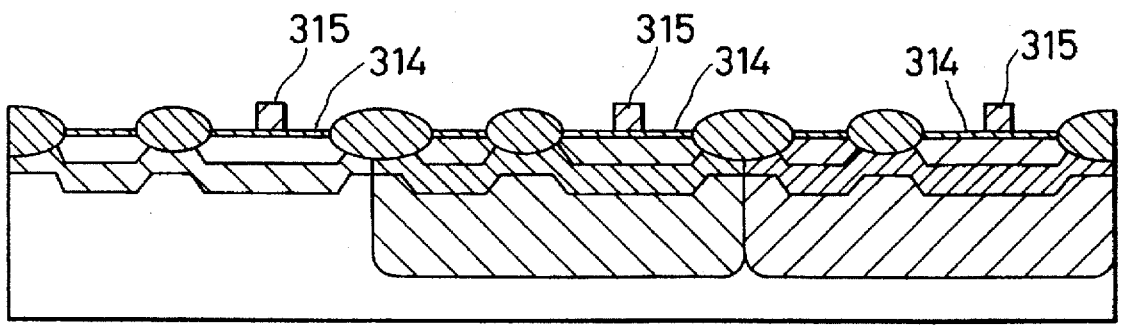
Figure 2F:
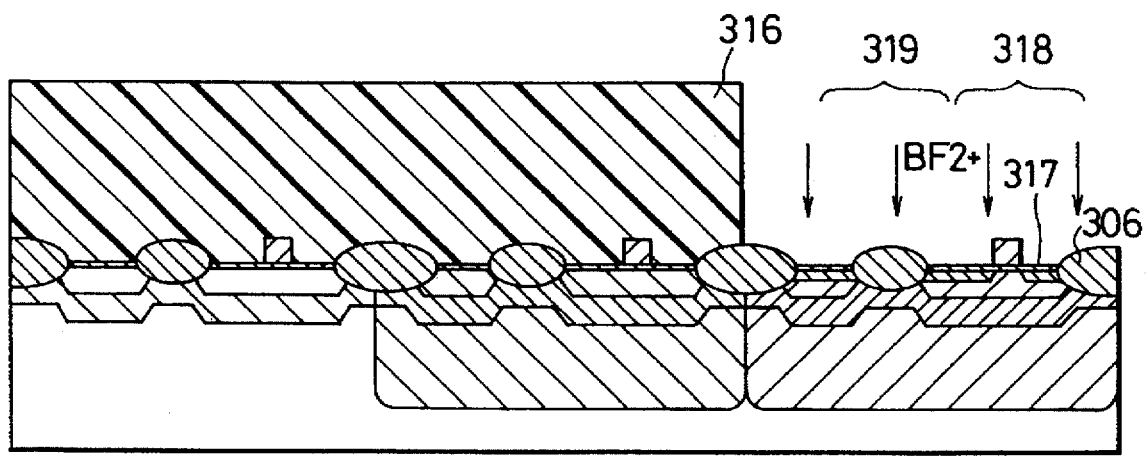
Figure 2G:
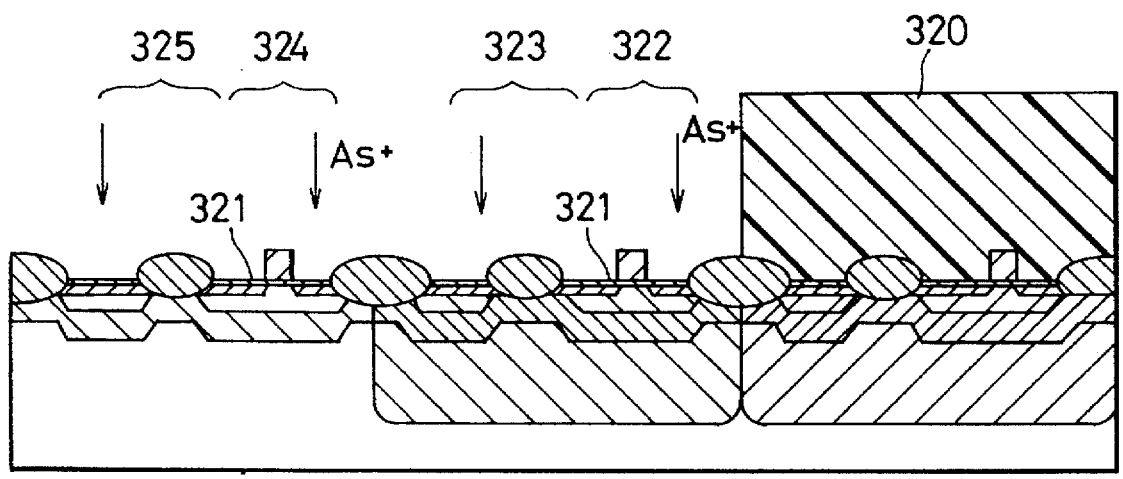
Figure 2H:
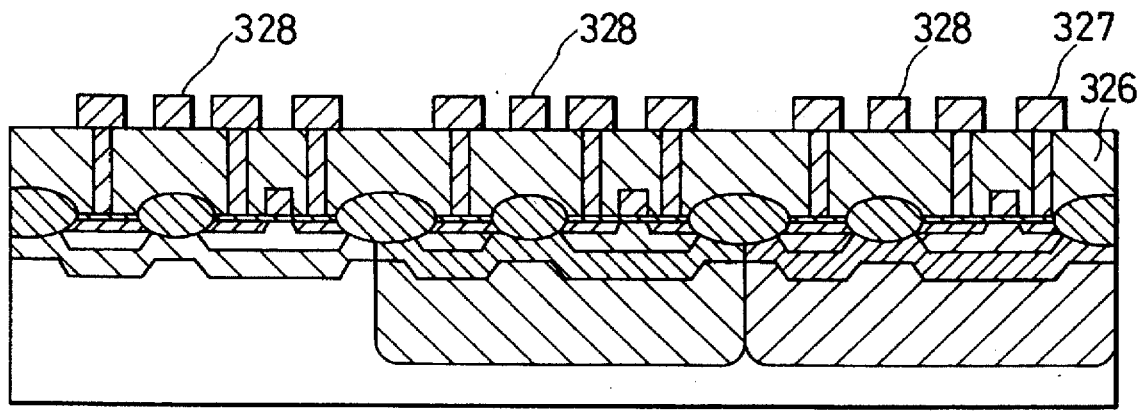
Figure 3:
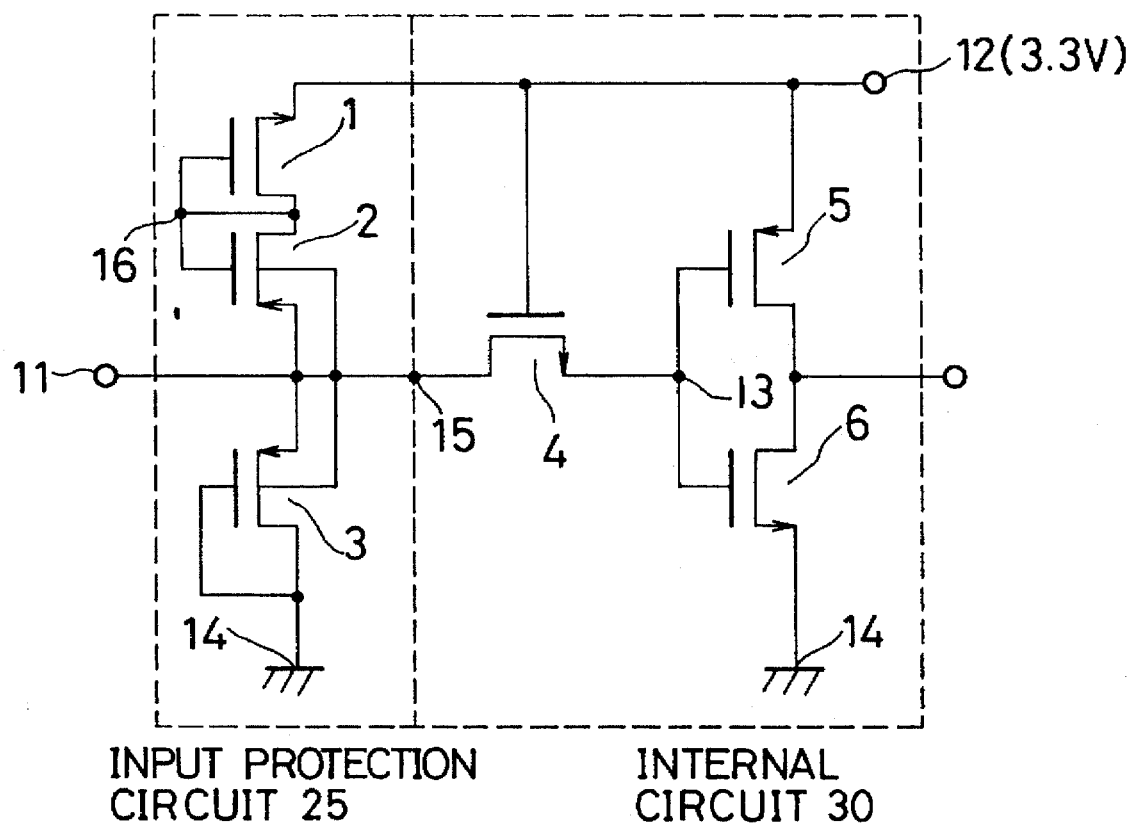
FIG. 3 is a circuit diagram of an input protection circuit to be fabricated in accordance with the present invention.
Figure 4:
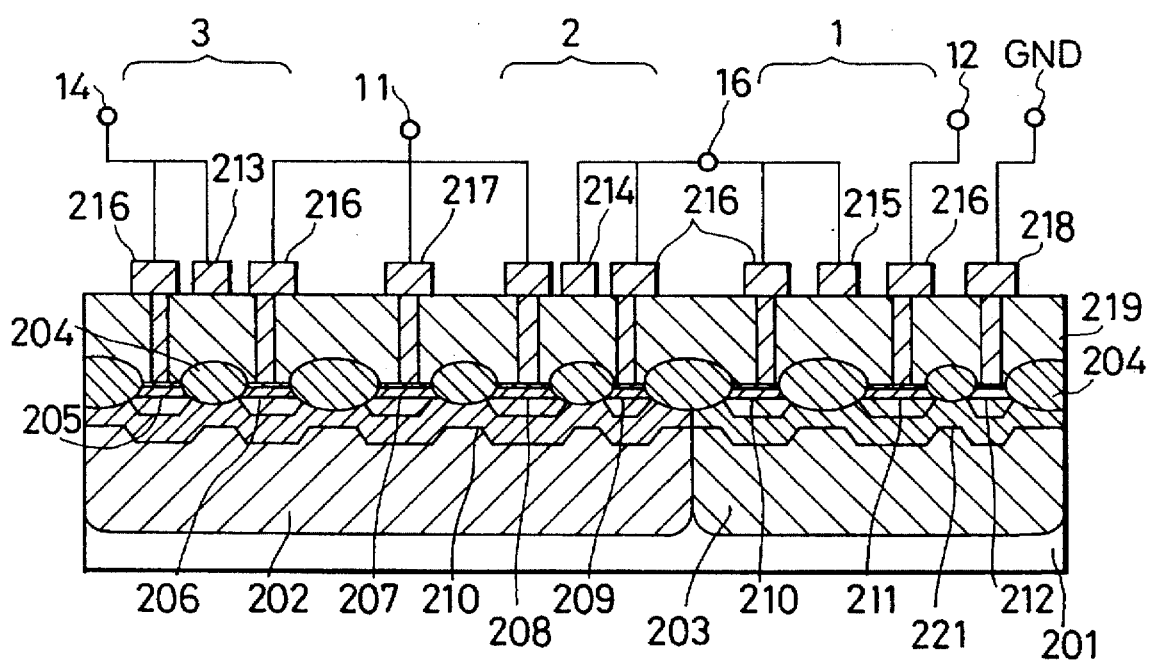
FIG. 4 is a cross-sectional view of the input protection circuit of the first embodiment.

With reference to FIG. 4, a cross-sectional structure of the input protection circuit 25 illustrated in FIG. 3 is explained hereinbelow. As illustrated in FIG. 4, elements constituting the input protection circuit 25 illustrated in FIG. 3 are to be formed in an n-well 202 and a p-well 203 formed in a p-type silicon substrate 201. The parasitic p-MOS FET 3 is formed in the n-well 202 to have a field oxide 204 as a gate oxide film, a $p^+$ diffusion layer 205 as a drain, a $p^+$ diffusion layer 206 as a source, and an aluminum electrode 213 as a gate electrode. Similarly, the parasitic p-MOS FET 2 is formed in the n-well 202 to have the field oxide 204 as a gate oxide film, a $p^+$ diffusion layer 209 as a drain, a $p^+$ diffusion layer 208 as a source, and an aluminum electrode 214 as a gate electrode. The parasitic n-MOS FET 1 is formed in the p-well 203 to have the field oxide 204 as a gate oxide film, an $n^+$ diffusion layer 210 as a drain, an $n^+$ diffusion layer 211 as a source, and an aluminum electrode 215 as a gate electrode. Each source and drain of the MOS FETs 1, 2 and 3 is electrically connected to an aluminum electrode 216, and further connected to the input terminal 11, power line 12, grounding line 14 or terminal 16.

An $n^+$ diffusion layer 207 provides better ohmic contact with the n-well 202, and is electrically connected to the input terminal 11 through an aluminum electrode 217. A $p^+$ diffusion layer 212 provides better ohmic contact with the p-well 203, and is electrically connected to the power line 12 through an aluminum electrode 218. The n-well 202 is electrically separated from an n-well formed in the internal circuit 30. There is formed an interlayer film 219 sandwiched between the aluminum electrodes 213–218 and the p-type silicon substrate 201. In the n-well 202 are formed $n^+$ channel stoppers 220, whereas in the p-well 203 are formed $p^+$ channel stoppers 221. The parasitic n-MOS FET 1 and p-MOS FETs 2, 3 are formed concurrently with the formation of the internal circuit 30, and hence it is no longer necessary to carry out an additional photomask step.

The input protection circuit 25 illustrated in FIG. 3 operates as follows. First will be explained an operation in normal state where a voltage in the range of 0 V to 5 V is applied to the input terminal 11.

When a voltage of 0 V is applied to the input terminal 11, no current runs between the input terminal 11 and the power line 12 because the parasitic n-MOS FET 1 disposed therebetween is in off-state.

When a voltage of 5 V is applied to the input terminal 11, the n-well 202 of the parasitic p-MOS FET 3 is biased to 5 V, and hence the p-MOS FET 3 attempts to shift to on-state. However, since the p-MOS FET 3 has the higher threshold voltage (−12 V) than the input voltage (5 V), no current runs between the input terminal 11 and the grounding line 14.

When a voltage of 5 V is applied to the input terminal 11, the terminal 16 also has a voltage of 5 V. However, since the parasitic n-MOS FET 1 having a threshold voltage of 12 V is disposed between the terminal 16 and the power line 12, no current runs between the input terminal 11 and the power line 12. Thus, even if a voltage of 5 V is applied to the input terminal 11, there is produced no current path between the power line 12 and the grounding line 14.

A voltage of 5 V is applied to a source 15 of the n-MOS FET 4 having a threshold voltage of 0 V. However, only a source voltage of 3.3 V is applied to a gate of n-MOS FET 4, a drain 13 of the n-MOS FET 4 has just a voltage of 3.3 V applied thereto. Thus, there is produced merely a voltage of 3.3 V everywhere in the circuit illustrated in FIG. 3, even if a voltage of 5 V is applied thereto.

Hereinbelow will be explained an operation when an extremely high voltage such as a voltage of thousands of volts is instantaneously applied to the input terminal 11. Namely, this relates to the resistance to electrostatic breakdown. When a positive voltage is applied to the input terminal 11, the parasitic p-MOS FETs 2, 3 and n-MOS FET 1 are shifted to on-state. Hence, a current caused by the applied voltage runs away to the ground line 14 and the power line 12 through the parasitic n- and p-MOS FETs 1, 2 and 3, and thus no excessive voltage is applied to the internal circuit 30. Under the application of a positive voltage to the input terminal 11, junctions formed between the n-well 202 and both the $p^+$ diffusion layers 205, 209 and the p-type silicon substrate 201 are reverse biased. However, since the n-well 202 has a relatively small impurity concentration, specifically about $1 \times 10^{17}$ cm$^{-3}$, there is produced a relatively great resistance, which would cause great voltage drop. In addition, the $p^+$ diffusion layers 205 and 209 are in general made of boron (B) to thereby have smooth impurity profile, and thus an electric field to be generated in the junctions is relaxed. As a result, even if a voltage of thousands of volts is applied to the input terminal 11, the circuit illustrated in FIG. 3 including the input protection circuit 25 and the internal circuit 30 would not be destroyed.

On the other hand, when a negative voltage is applied to the input terminal 11, a junction formed between the n-well 202 and the p-type silicon substrate 201 is forward biased. Thus, electric charges flow into the p-type silicon substrate 201, and hence no excessive voltage is applied to the internal circuit 30. In addition, since the n-well 202 has relatively high resistance, great voltage drop is caused. Thus, no excessive current runs through the input protection circuit 25, it is not destroyed.

Hereinbelow, with reference to FIGS. 5A to 5G, will be explained a method of fabricating a semiconductor integrated circuit to be carried out in accordance with an embodiment of the present invention. In this embodiment, a conventional input protection circuit is manufactured without an additional photomask step.

Figure 5A:
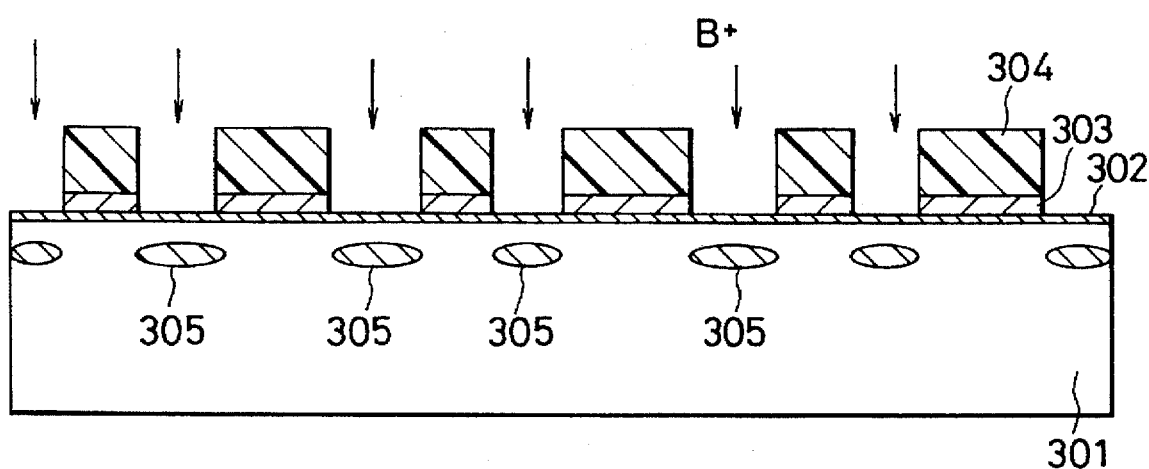
FIGS. 5A to 5G are cross-sectional views of an input protection circuit, showing respective step of a method to be carried out in accordance with an embodiment of the present invention.

First, as illustrated in FIG. 5A, on a p-type silicon substrate 301 are formed a pad oxide film 302 and a nitride film 303. Then, an active region is covered with photoresist 304, which is in turn patterned. Then, the nitride film 303 is etched by using the patterned photoresist 304 as a mask. Subsequently, ion-implanting of boron (B) is carried out to the p-type silicon substrate 301 at 100 KeV at a dose of about $5 \times 10^{12}$ cm$^{-2}$ by using the residual photoresist 304 and nitride film 303 as a mask, thereby forming $p^-$ channel stoppers 305.

Figure 5B:
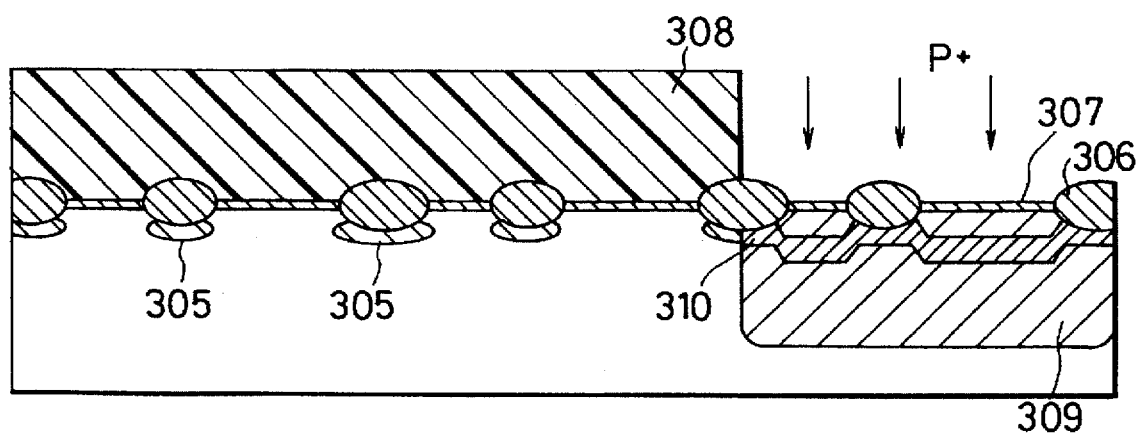

Then, as illustrated in FIG. 5B, after the photoresist 304 has been removed, the p-type silicon substrate 301 is selectively oxidized by using the nitride film 303 as a mask to thereby form field oxides 306 for element isolation. While the selective oxidation of the p-type silicon substrate 301, boron contained in the $p^-$ channel stoppers 305 are activated.

After removal of the nitride film 303 and the pad oxide film 302, an oxide film 307 is made grown by a thickness of 20 nm. Then, a region other than a region in which a p-MOS FET is to be formed is covered with photoresist 308, followed by ion-implanting of phosphorus (P) at 1 MeV at a dose of about $3 \times 10^{13}$ cm$^{-2}$ to thereby form n-wells 309. Successively, ion-implanting of phosphorus (P) is carried out at 400 KeV at a dose of about $1.3 \times 10^{13}$ cm$^{-2}$ to thereby form an $n^+$ channel stopper 310. The $n^+$ channel stopper 310 is formed overlapping the $p^-$ channel stoppers 305 having already been formed in the p-MOS FET formation region. The formation of the $n^+$ channel stopper 310 inverts the conductivity of the $p^-$ channel stoppers 305 to n-type. In addition, the formation of the $n^+$ channel stopper 310 causes the parasitic p-MOS FET having the field oxides 306 as a gate oxide film to have a threshold voltage of about −12 V, thereby suppressing current leakage between the p-MOS FETs. Then, though not illustrated, ion-implanting of boron (B) is carried out to cause the p-MOS FET to have a threshold voltage of −0.6 V.

Figure 5C:
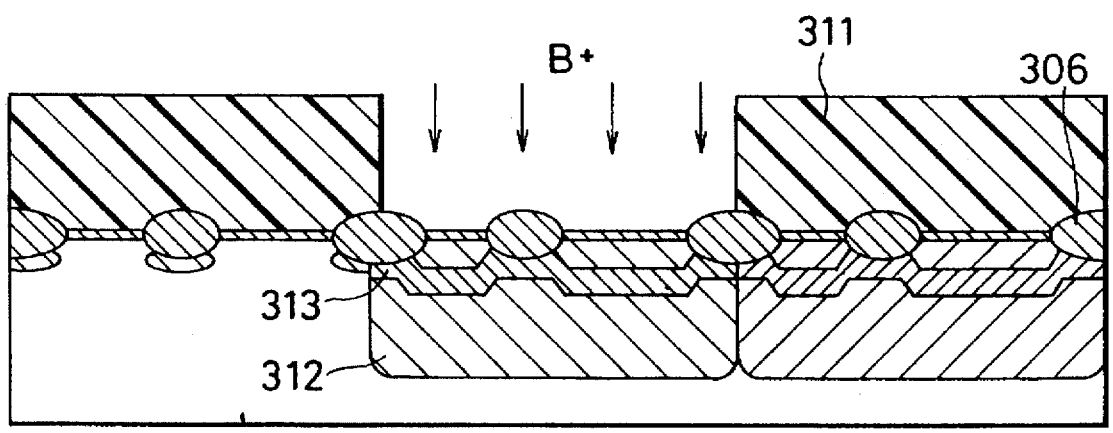

After removal of the photoresist 308, as illustrated in FIG. 5C, a region other than a region in which an n-MOS FET having a threshold voltage of 0.6 V is to be formed is covered with photoresist 311. Boron (B) is ion-implanted to the p-type silicon substrate 301 through a non-masked surface thereof at 500 KeV at a dose of about $3 \times 10^{13}$ cm$^{-2}$ to thereby form a p-well 312. Subsequently, boron (B) is ion-implanted to the p-well 312 at 200 KeV at a dose of about $7 \times 10^{12}$ cm$^{-2}$ to thereby form a $p^+$ channel stopper 313. Herein, even if a small dose of boron is ion-implanted, it is possible to obtain a sufficient impurity concentration just beneath the field oxides 306 due to the presence of the $p^-$ channel stoppers 305 which have been already formed. The formation of the $p^+$ channel stopper 313 causes a parasitic n-MOS FET having the field oxides 306 as a gate oxide film to have a threshold voltage of about 12 V, which would suppress current leakage between n-MOS FETs. Then, though not illustrated, ion-implanting of boron (B) is carried out to cause the n-MOS FET to have a threshold voltage of 0.6 V.

In a region covered with the photoresist 311 is to be formed an n-MOS FET having a threshold voltage of 0 V. In addition, since only the $p^-$ channel stoppers 305 are formed in the region, the parasitic n-MOS FET having the field oxides 306 as a gate oxide film has a threshold voltage of about 6 V.

Figure 5D:
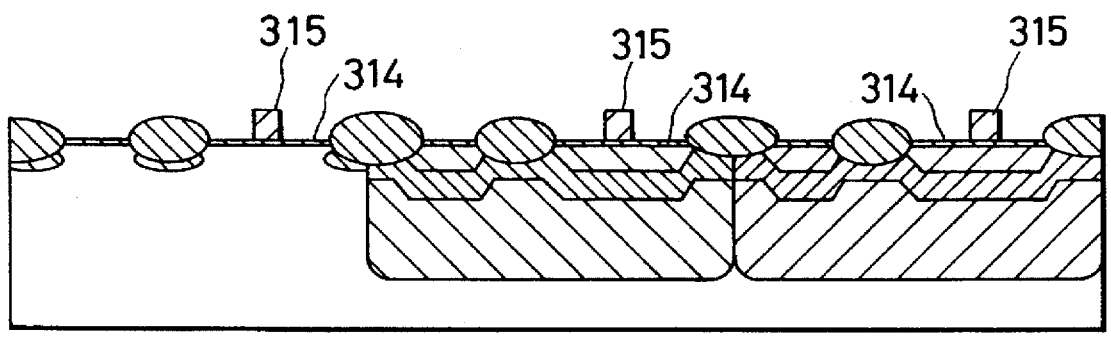

Then, as illustrated in FIG. 5D, after the photoresist 311 and the oxide film 307 have been removed, a gate oxide film 314 is made grown by a thickness of 10 nm. Three gate electrodes 315 are formed of polysilicon on the gate oxide film 314.

Figure 5E:
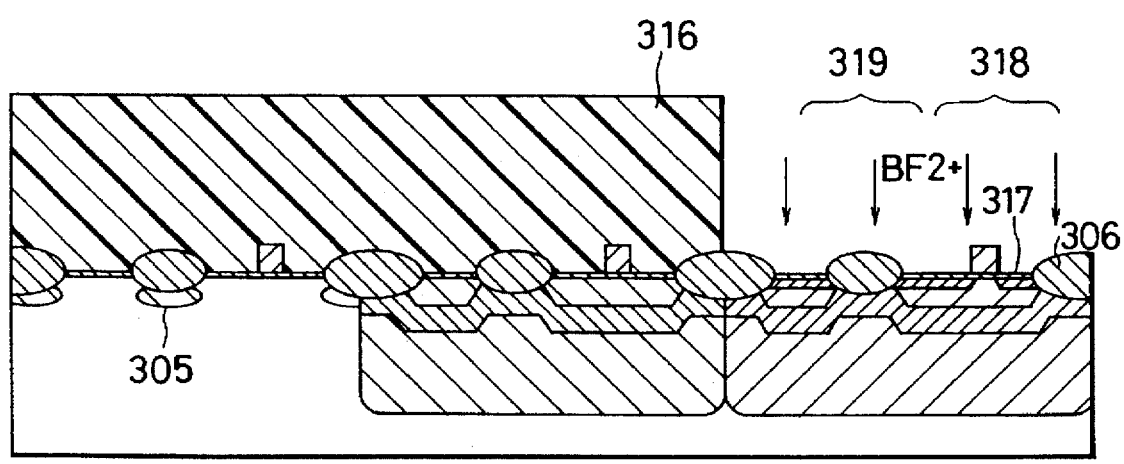

Then, as illustrated in FIG. 5E, a region other than a region in which a p-MOS FET is to be formed is covered with photoresist 316. Ion-implanting of $BF_2$ is carried out to the p-type silicon substrate 301 through a non-masked surface thereof at 70 KeV at a dose of about $3\times10^{15}$ cm$^{-2}$ to thereby form a p$^+$ diffusion layer 317. Thus, there are formed a p-MOS FET 318 having a threshold voltage of −0.6 V and a parasitic p-MOS FET 319 having the field oxides 306 as a gate oxide and also having a threshold voltage of −12 V.

Figure 5F:
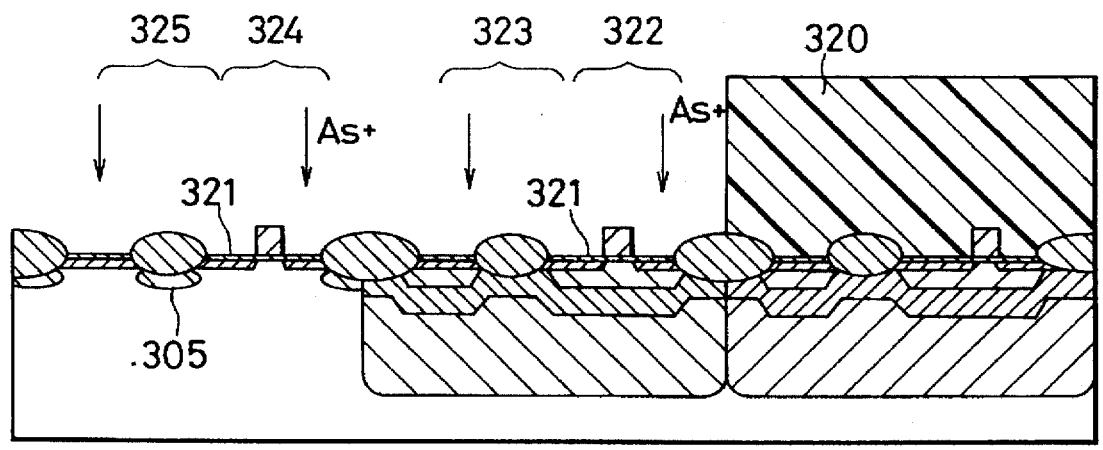

Then, as illustrated in FIG. 5F, after the photoresist 316 has been removed, a region in which the p-MOS FET is to be formed is covered with photoresist 320. Subsequently, ion-implanting of arsenic (As) is carried out at 70 KeV at a dose of about $3\times10^{15}$ cm$^{-2}$ to thereby form an n$^+$ diffusion layer 321. Thus, there are formed an n-MOS FET 322 having a threshold voltage of −0.6 V, a parasitic n-MOS FET 323 having the field oxides 306 as a gate oxide and also having a threshold voltage of 12 V, an n-MOS FET 324 having a threshold voltage of 0 V, and a parasitic n-MOS FET 325 having the field oxides 306 as a gate oxide and also having a threshold voltage of 6 V.

Figure 5G:
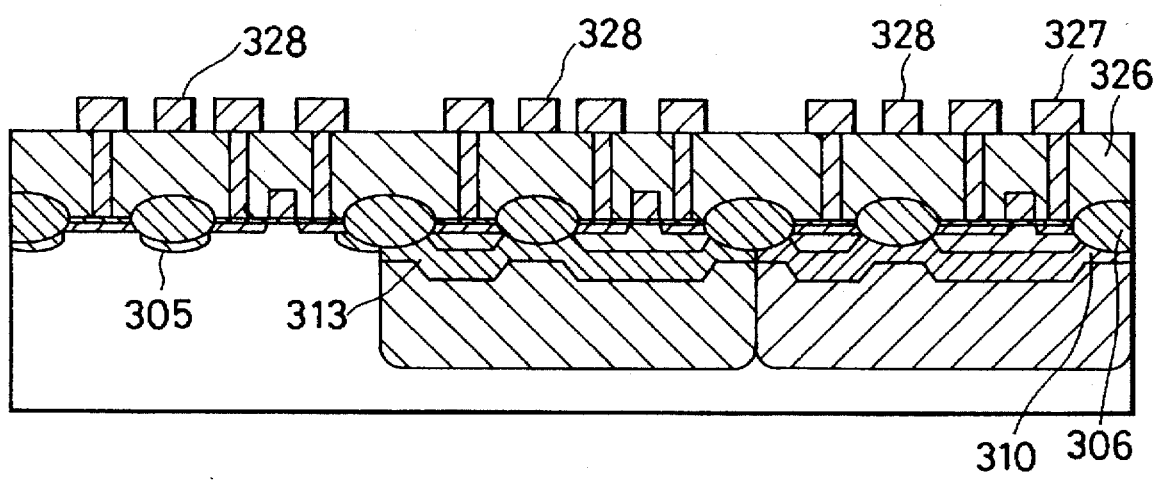

Then, as illustrated in FIG. 5G, an interlayer insulating film 326 is deposited over a resultant. There are formed contact holes through the interlayer insulating film 326, and then aluminum electrodes 327 and the aluminum gate electrodes 328 are formed. Thus, the semiconductor integrated circuit is completed.

In accordance with the method having been explained with reference to FIGS. 5A to 5G, it is possible to form the parasitic n-MOS FET 325 having a low threshold voltage (6 V in the embodiment), and hence also possible to construct an input protection circuit without an additional photoresist step.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An input protecting circuit comprising:
   a first MOS FET including a source electrically connected to an input terminal, and a drain and a gate both electrically connected to a grounding line;
   a second MOS FET including a source electrically connected to said input terminal, and a drain and a gate; and
   a third MOS FET including a source electrically connected to a power line, and a drain and a gate to both of which are electrically connected a drain and a gate of said second MOS FET.

2. The input protection circuit as set forth in claim 1, wherein said first and second MOS FETs are p-channel parasitic MOS FETs having a low threshold value.

3. The input protection circuit as set forth in claim 1, wherein said third MOS FET is an n-channel parasitic MOS FET having a high threshold value.

4. The input protection circuit as set forth in claim 2, wherein said third MOS FET is an n-channel parasitic MOS FET having a high threshold value.

5. The input protection circuit as set forth in claim 1, wherein said first MOS FET has a field oxide film as a gate oxide film, and has the same threshold voltage as that of device isolation regions.

6. The input protection circuit as set forth in claim 1, wherein said second MOS FET has a field oxide film as a gate oxide film, and has the same threshold voltage as that of device isolation regions.

7. The input protection circuit as set forth in claim 1, wherein said third MOS FET has a field oxide film as a gate oxide film, and has the same threshold voltage as that of device isolation regions.

8. The input protection circuit as set forth in claim 4, wherein said first MOS FET has a field oxide film as a gate oxide film, and has the same threshold voltage as that of device isolation regions.

9. The input protection circuit as set forth in claim 4, wherein said second MOS FET has a field oxide film as a gate oxide film, and has the same threshold voltage as that of device isolation regions.

10. The input protection circuit as set forth in claim 4, wherein said third MOS FET has a field oxide film as a gate oxide film, and has the same threshold voltage as that of device isolation regions.

* * * * *